US012568652B2

(12) United States Patent
Mochizuki et al.

(10) Patent No.: US 12,568,652 B2
(45) Date of Patent: Mar. 3, 2026

(54) FORMING GATE ALL AROUND DEVICE WITH SILICON-GERMANIUM CHANNEL

(71) Applicant: International Business Machines Corporation, Armonk, NY (US)

(72) Inventors: Shogo Mochizuki, Mechanicville, NY (US); Andrew M. Greene, Slingerlands, NY (US); Gen Tsutsui, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 513 days.

(21) Appl. No.: 17/936,604

(22) Filed: Sep. 29, 2022

(65) Prior Publication Data

US 2024/0113192 A1      Apr. 4, 2024

(51) Int. Cl.
| | |
|---|---|
| *H10D 30/67* | (2025.01) |
| *H10D 30/01* | (2025.01) |
| *H10D 30/43* | (2025.01) |
| *H10D 62/10* | (2025.01) |
| *H10D 62/13* | (2025.01) |

(52) U.S. Cl.
CPC ....... *H10D 30/6735* (2025.01); *H10D 30/014* (2025.01); *H10D 30/43* (2025.01); *H10D 30/6757* (2025.01); *H10D 62/121* (2025.01); *H10D 62/151* (2025.01)

(58) Field of Classification Search
CPC ............. H01L 29/42392; H01L 29/067; H01L 29/0847; H01L 29/66439; H01L 29/775; H01L 29/78696; H01L 29/0653
USPC ........................................ 257/288
See application file for complete search history.

(56) References Cited

U.S. PATENT DOCUMENTS

| | | | | |
|---|---|---|---|---|
| 8,288,825 | B2 | 10/2012 | Chong | |
| 8,753,942 | B2 | 6/2014 | Kuhn | |
| 10,263,100 | B1 * | 4/2019 | Bi | H10D 62/364 |
| 10,910,482 | B2 | 2/2021 | Cheng | |
| 2015/0364555 | A1 * | 12/2015 | Cheng | H10D 86/215 |
| | | | | 257/347 |
| 2020/0266060 | A1 * | 8/2020 | Cheng | H10D 62/116 |

(Continued)

FOREIGN PATENT DOCUMENTS

| | | |
|---|---|---|
| TW | 202236434 A | 9/2022 |
| TW | 202236668 A | 9/2022 |

OTHER PUBLICATIONS

Barraud et al., "VerticallyStacked-NanoWiresMOSFETs in a Replacement Metal Gate Process with Inner Spacer and SiGe Source/Drain", Submitted on Jan. 8, 2019, 5 pages, <https://hal-cea.archives-ouvertes.fr/cea-01973383>.

(Continued)

*Primary Examiner* — Duy T Nguyen
*Assistant Examiner* — Jiyoung Oh
(74) *Attorney, Agent, or Firm* — Joseph P. Curcuru

(57) ABSTRACT

Embodiments herein include semiconductor structures that may include a semiconductor structure for improving the switching speed of a first transistor. The first transistor may include a first source/drain (S/D), a metal gate, a spacer between the first S/D and the metal gate, and a first nanosheet channel. The first nanosheet channel may include: a gate section with silicon-germanium (SiGe) surrounded by the metal gate; and a junction section comprising silicon surrounded by the spacer.

15 Claims, 10 Drawing Sheets

(56) References Cited

U.S. PATENT DOCUMENTS

2022/0238678 A1    7/2022  Lee
2022/0302135 A1    9/2022  Liaw

OTHER PUBLICATIONS

Cheng et al., "4-Levels Vertically Stacked SiGe Channel Nanowires Gate-All-Around Transistor with Novel Channel Releasing and Source and Drain Silicide Process", Published: Mar. 7, 2022, 10 pages, <https://www.mdpi.com/2079-4991/12/5/889>.
Lee et al., "N-Type Nanosheet FETs without Ground Plane Region for Process Simplification", Published: Mar. 11, 2022, 10 pages, <https://www.mdpi.com/2072-666X/13/3/432>.

* cited by examiner

FORMING GATE ALL AROUND DEVICE WITH SILICON-GERMANIUM CHANNEL

BACKGROUND

The present invention relates generally to the field of fabrication of semiconductor devices, and more particularly to forming a nanosheet channel with a gate section having one percentage of germanium in the silicon, and a junction section having a different percentage of germanium.

In fabricating semiconductor devices, millions of devices can be located together on a single substrate. The continued scaling of metal oxide semiconductor field effect transistors (MOSFETs) has enabled useful control of these millions of devices. Stacked nanosheet designs seek to continue improvement in performance by using several thin channels with gate electrodes. Nanosheet transistors typically start with a Si/SiGe heterostructure, with as many layer pairs as the finished device will have channels. The channels are fabricated as nanosheet layers built up as blanket layers over the surface of the wafer, with dummy layers alternately fabricated or grown as blanket layers between the channel layers.

One challenge in fabricating the channels is the selection and application of the channel material. For nFET (i.e., n+ type field-effect transistor) devices the most desirable material for a channel is one in which electrons travel faster (e.g., silicon), so that the gate turns the signal on/off in the channel more quickly and efficiently. On the other hand, pFET devices should use a material in which holes travel faster (e.g., silicon-germanium (SiGe)). Creating multiple types of channel materials is challenging due to the blanket layer manner of fabrication.

SUMMARY

According to one embodiment of the present invention, a semiconductor structure for improving the switching speed of a first transistor is disclosed. The first transistor may include a first source/drain (S/D), a metal gate, a spacer between the first S/D and the metal gate, and a first nanosheet channel. The first nanosheet channel may include: a gate section with silicon-germanium (SiGe) surrounded by the metal gate; and a junction section comprising silicon surrounded by the spacer. The SiGe may be uniform or graded, depending on a diffusion of germanium into a trimmed silicon nanosheet channel. The SiGe has properties that respond faster to certain switch conditions within the first transistor. For example, the holes within the SiGe move faster when the first transistor is part of a pFET semiconductor structure. The performance is improved overall by increasing the speed of hole mobility and lowering the signal voltage used by the metal gate. When the first nanosheet channel has the gate section and the junction section, then the first nanosheet channel may be fabricated initially with known nanosheet fabrication methods, and then subsequently converted into SiGe within the gate section.

Certain embodiments may include structures in which the first transistor is a pFET device such that a S/D of the first transistor includes a p+ material and adjacent nFET devices include a n+ S/D material. The first nanosheet may also be part of a stack field-effect transistor (FET) such that a second nanosheet channel is stacked with the first nanosheet channel to increase the density of the overall semiconductor structure.

Certain embodiments may include an orientation in which the junction section contacts the first S/D. The junction section may be surrounded by the spacer and the contact with the first S/D makes it so that the electrical signal from the first S/D to the nanosheet channel is present and strong. The SiGe may also be at least partially between the metal gate and the junction section so that the silicon of the junction section does not contact the metal gate. This configuration of the SiGe may also show that the nanosheet channel has been fabricated using a cladding and thermal diffusion method.

According to one embodiment of the present invention, a method is disclosed. The method may include trimming a gate section of a first nanosheet channel of a pFET transistor. The nanosheet channel may be supported by spacers at a junction section. The method may also include cladding the gate section with silicon-germanium (SiGe); and diffusing the germanium of the SiGe uniformly within the gate section. Cladding and diffusing the germanium is beneficial for the transistor, since the resulting SiGe switches faster and therefore allows signals to pass through the pFET transistor more quickly and with less voltage/power delivered from a metal gate.

Certain embodiments may be formed with the pFET transistor formed adjacent to or close-by an nFET transistor. The nFET transistor may be masked during the trimming of the nanosheet channel. Dummy layers within the nFET may be removed before or after diffusing the germanium within the gate section. Furthermore, certain embodiments may clad and diffuse the germanium without diffusing the germanium into the junction section. This provides the benefit of a differentiation between the composition of the junction section and the gate section.

According to one embodiment of the present invention, a semiconductor structure is disclosed. The semiconductor structure may include a first nanosheet channel between a first source/drain (S/D) and a second S/D. The first nanosheet may include a first junction section having silicon and a first percentage of germanium, and a gate section having silicon-germanium (SiGe) at a second percentage of germanium. Dividing the first nanosheet channel into the junction section and the gate section provides the benefit of faster switching. For example, the holes within the SiGe move faster when the first transistor is part of a pFET semiconductor structure. When the first nanosheet channel has the gate section and the junction section, then the first nanosheet channel may be fabricated initially with known nanosheet fabrication methods, and then subsequently converted into SiGe within the gate section.

BRIEF DESCRIPTION OF THE DRAWINGS

FIG. 1A shows a pFET device at a cross-sectional view in a first direction. FIG. 1B shows an nFET device at a cross-sectional view in the first direction. FIG. 1C shows the pFET device at a cross-sectional view in a second direction that is perpendicular to the first direction. FIG. 1D shows the nFET device at a cross-sectional view in the second direction.

FIG. 2A shows the pFET device at a cross-sectional view in the first direction. FIG. 2B shows the nFET device at a cross-sectional view in the first direction. FIG. 1C shows the pFET device at a cross-sectional view in the second direction. FIG. 1D shows the nFET device at a cross-sectional view in the second direction.

FIG. 3A shows the pFET device at a cross-sectional view in the first direction. FIG. 3B shows the nFET device at a cross-sectional view in the first direction. FIG. 3C shows the pFET device at a cross-sectional view in the second direction. FIG. 3D shows the nFET device at a cross-sectional view in the second direction.

FIG. 4A shows the pFET device at a cross-sectional view in the first direction. FIG. 4B shows the nFET device at a cross-sectional view in the first direction. FIG. 4C shows the pFET device at a cross-sectional view in the second direction. FIG. 4D shows the nFET device at a cross-sectional view in the second direction.

FIG. 5A shows the pFET device at a cross-sectional view in the first direction. FIG. 5B shows the nFET device at a cross-sectional view in the first direction. FIG. 5C shows the pFET device at a cross-sectional view in the second direction. FIG. 5D shows the nFET device at a cross-sectional view in the second direction.

FIG. 6A shows the pFET device at a cross-sectional view in the first direction. FIG. 6B shows the nFET device at a cross-sectional view in the first direction. FIG. 6C shows the pFET device at a cross-sectional view in the second direction. FIG. 6D shows the nFET device at a cross-sectional view in the second direction.

FIG. 7A shows the pFET device at a cross-sectional view in the first direction. FIG. 7B shows the nFET device at a cross-sectional view in the first direction. FIG. 7C shows the pFET device at a cross-sectional view in the second direction. FIG. 7D shows the nFET device at a cross-sectional view in the second direction.

FIG. 8A shows a pFET device at a cross-sectional view in the first direction. FIG. 8B shows an nFET device at a cross-sectional view in the first direction. FIG. 8C shows the pFET device at a cross-sectional view in the second direction. FIG. 8D shows the nFET device at a cross-sectional view in the second direction.

FIG. 9A shows the pFET device at a cross-sectional view in the first direction. FIG. 9B shows the nFET device at a cross-sectional view in the first direction. FIG. 9C shows the pFET device at a cross-sectional view in the second direction. FIG. 9D shows the nFET device at a cross-sectional view in the second direction.

FIG. 10A shows the pFET device at a cross-sectional view in the first direction. FIG. 10B shows the nFET device at a cross-sectional view in the first direction. FIG. 10C shows the pFET device at a cross-sectional view in the second direction. FIG. 10D shows the nFET device at a cross-sectional view in the second direction.

DETAILED DESCRIPTION

Figures 1A, 1B, 1C, 1D:
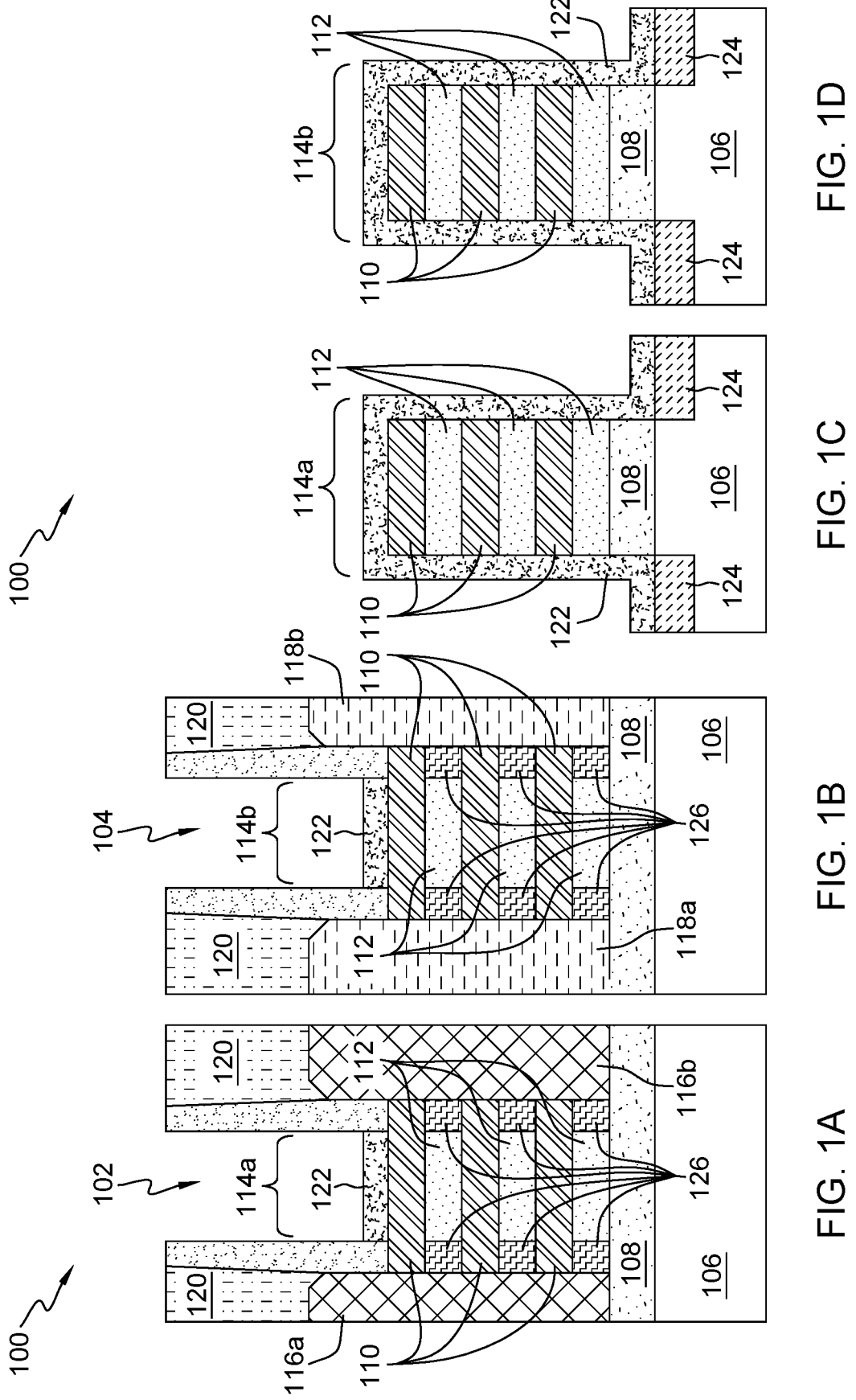
FIGS. 1A-1D depict cross-sectional side views of a semiconductor device at a stage of fabrication, in accordance with one embodiment of the present invention.

In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical and electrical changes may be made without departing from the described embodiments. The following detailed description is, therefore, not to be taken in a limiting sense, and the included embodiments are defined by the appended claims.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "right," "left," "vertical," "horizontal," "top," "bottom," "lower," "upper" and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

With regard to the fabrication of transistors and integrated circuits, major surface refers to that surface of the semiconductor layer in and about which a plurality of transistors are fabricated, e.g., in a planar process. As used herein, the term "vertical" means substantially orthogonal with respect to the major surface and "horizontal" means substantially parallel to the major surface. Typically, the major surface is along a plane of a monocrystalline silicon layer on which transistor devices are fabricated.

For integrated circuits, the masking, patterning, and etching of device components makes possible the fabrication of semiconductor devices at the micro and nano scale. Such small component size means that improvements in performance require high precision in the dimensions and materials used in the completed devices. For the instant invention, the improvement includes changes to the channel that is formed between source/drains (S/Ds) of a transistor device; in particular, the S/Ds of pFET (p+ field-effect transistor (FET)) devices. While nFET (n+ FET) devices rely on the movement of electrons to turn on or turn off the device, pFET devices use the movement of "holes" (i.e., space with a lack of electrons) to turn on or turn off the device. This difference means that channel formation from one material may disadvantage the speed at which one type of device is turned on/off. Since most integrated circuits and fabricated with nFET and pFET devices on one chip, the invention disclosed herein includes a pFET channel that is converted from a silicon gate section to a silicon-germanium (SiGe) gate section. This conversion from silicon gate section to SiGe gate section enables known/effective fabrication of the nanosheet channels, with the added benefit of fast signal switching for both nFET and pFET devices with the semiconductor device.

Turning now to the figures, FIGS. 1A-1D depict cross-sectional side views of a semiconductor device 100 at a stage of fabrication. The semiconductor device 100 may be fabricated as a relationship of rows and columns of nFET and pFET devices. FIG. 1A shows a pFET device 102 at a cross-sectional view in a first direction across the gate. FIG. 1B shows an nFET device 104 at a cross-sectional view in the first direction across the gate. FIG. 1C shows the pFET device 102 at a cross-sectional view in a second direction across the nanosheet that is perpendicular to the first direction. FIG. 1D shows the nFET device 104 at a cross-sectional view in the second direction across the nanosheet. The pFET device 102 may be fabricated adjacent to the nFET device 104, but that is not a requirement for the invention. The respective A, B, C, and D figures below will keep these same cross-sectional views (i.e., in the first direction and the second direction) of the pFET device 102 and the nFET device 104.

Various and sundry fabrication methods may be used to arrive at the semiconductor structure 100 shown in FIGS. 1A-1D. For example, the semiconductor device 100 may be fabricated on a substrate 106. The substrate 106 most often includes silicon, but other materials may also be used. Above the substrate 106, the semiconductor structure 100 includes layers that will become the nanosheet channels 110 for both the pFET device 102 and the nFET device 104. The nanosheet channels 110 are separated from the substrate 106 by an isolation layer 108. The nanosheet layers may be fabricated, for example, by forming epitaxial semiconductor layers sequentially above the bottom-most semiconductor layer above the substrate 106. Initially, a layer of silicon and a layer of BOX $SiO_2$ may be fabricated above the silicon substrate 106. Then the layers may be epitaxially grown using alternating dummy layers 112 and channel layers 110 of silicon. Other methods may be used to form the nanosheet channels 110 and the dummy layers 112. Certain embodiments may also include other forms of transistors. In certain embodiments, a bottom high percentage SiGe layer may be used to later form a dielectric isolation layer.

Once the silicon layers for the nanosheet channels 110 and the SiGe dummy layers 112 are fabricated, individual fins may be cut or etched to form the nanosheet structures. In certain embodiments, a dummy gate is formed over the nanosheet fin structures. Moreover, spacers may be deposited on the sides of the nanosheet fin structures, followed by sacrificial SiGe indentation and inner spacer deposition and etch back. The nanosheet channels 110 and the SiGe dummy layers 112 may also include source/drain patterning and growth completed with source/drains (S/Ds) grown on each side of the fin. Certain embodiments may also include a dummy poly pull step as part of the sequence for fabricating the semiconductor structure 100.

The result of the foregoing fabrication steps is the semiconductor structure 100 that includes a first gate region 114a of the pFET 102 has a first (pFET) S/D 116a grown on one side and a second (pFET) S/D 116b grown on the other side; and a second gate region 114b of the nFET 104 has a first (nFET) S/D 118a grown on one side and a second (nFET) S/D 118b grown on the other side. After growing on the semiconductor structure 100, the S/Ds 116a, b, 118a, b are covered by an interlayer dielectric (ILD) 120 at the fabrication stage illustrated in FIGS. 1A, 1B, 1C, and 1D. The gate regions 114a, b may also be covered, for example with a protective layer 122.

Other components of the semiconductor structure 100 include shallow trench isolations (STI) 124 between the gate regions 114a, b, of the substrate 106 that isolate each of the pFET 102 and nFET 104 from other devices in the semiconductor structure 100. Also, the semiconductor structure 100 may also include spacers 126 that are formed when the SiGe dummy layers 112 are recessed from the direction of the S/Ds 116, 118. The recessions in the dummy layers 112 are filled with a dielectric to form the spacers 126 between the S/Ds 116, 118 and the gate region 114a, b. The spacers 126 typically do not protrude into the S/D regions 116, 118 and therefore the spacers 126 and the nanosheet channels 110 are flush with each other. The spacers 126 may include nitride based material such as silicon boron carbide nitride (SiBCN), SiOCN, SiN, SiOC, etc. or other non-nitride based masking materials.

Figures 2A, 2B, 2C, 2D:
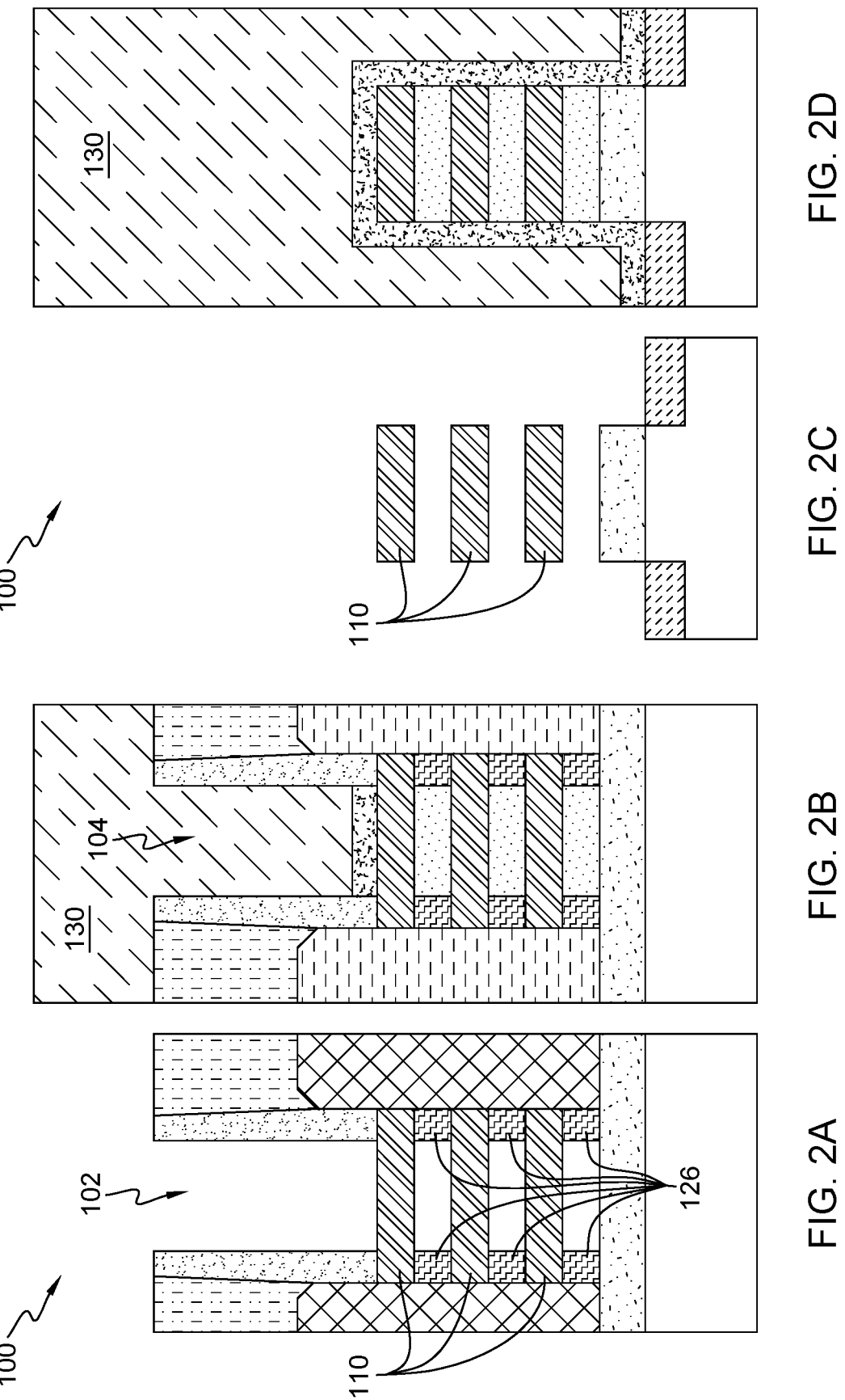
FIGS. 2A-2D depict cross-sectional side views of the semiconductor device of FIGS. 1A-1D at a stage of fabrication, in accordance with one embodiment of the present invention.
Figures 3A, 3B, 3C, 3D:
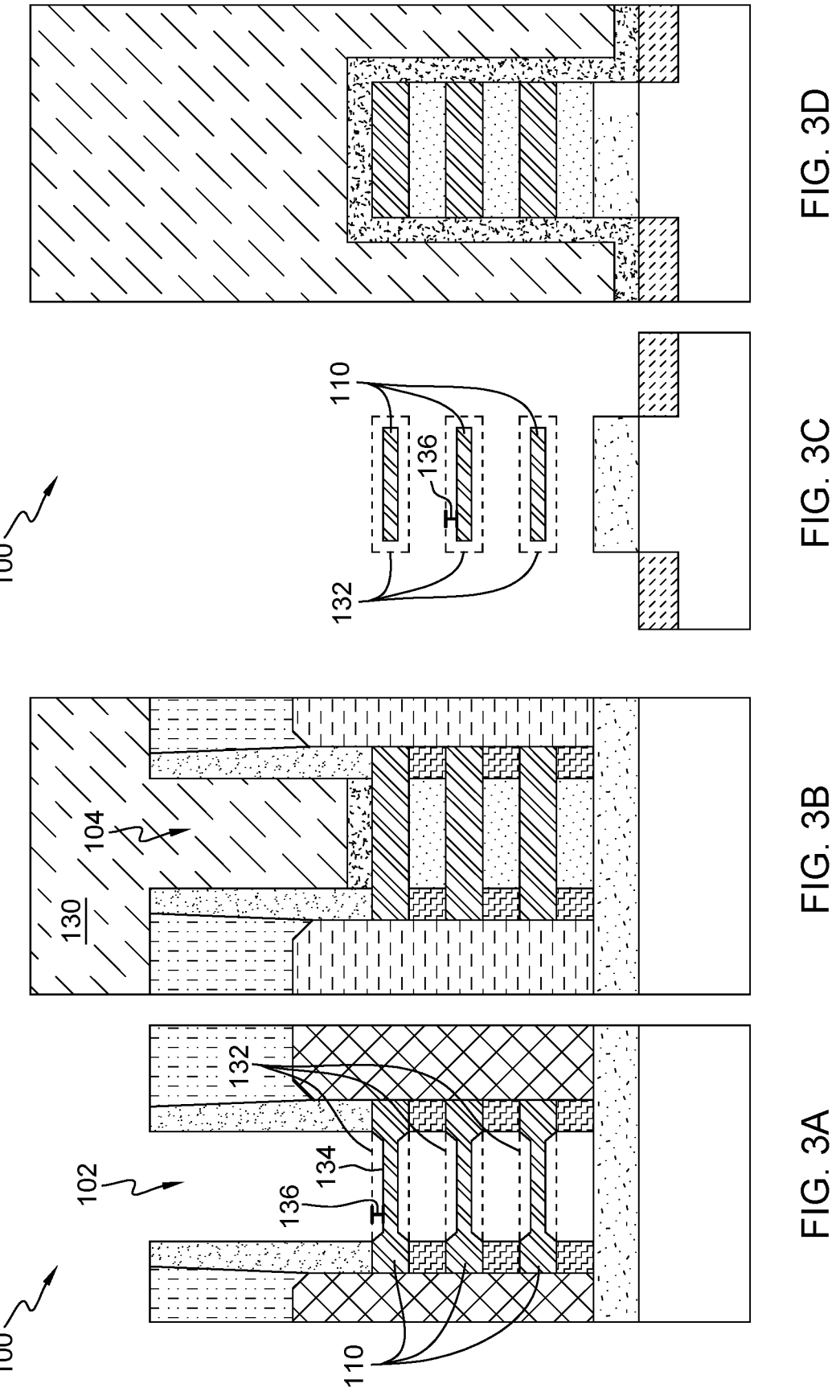
FIGS. 3A-3D depict cross-sectional side views of the semiconductor device of FIGS. 1A-1D at a stage of fabrication, in accordance with one embodiment of the present invention.
Figures 4A, 4B, 4C, 4D:
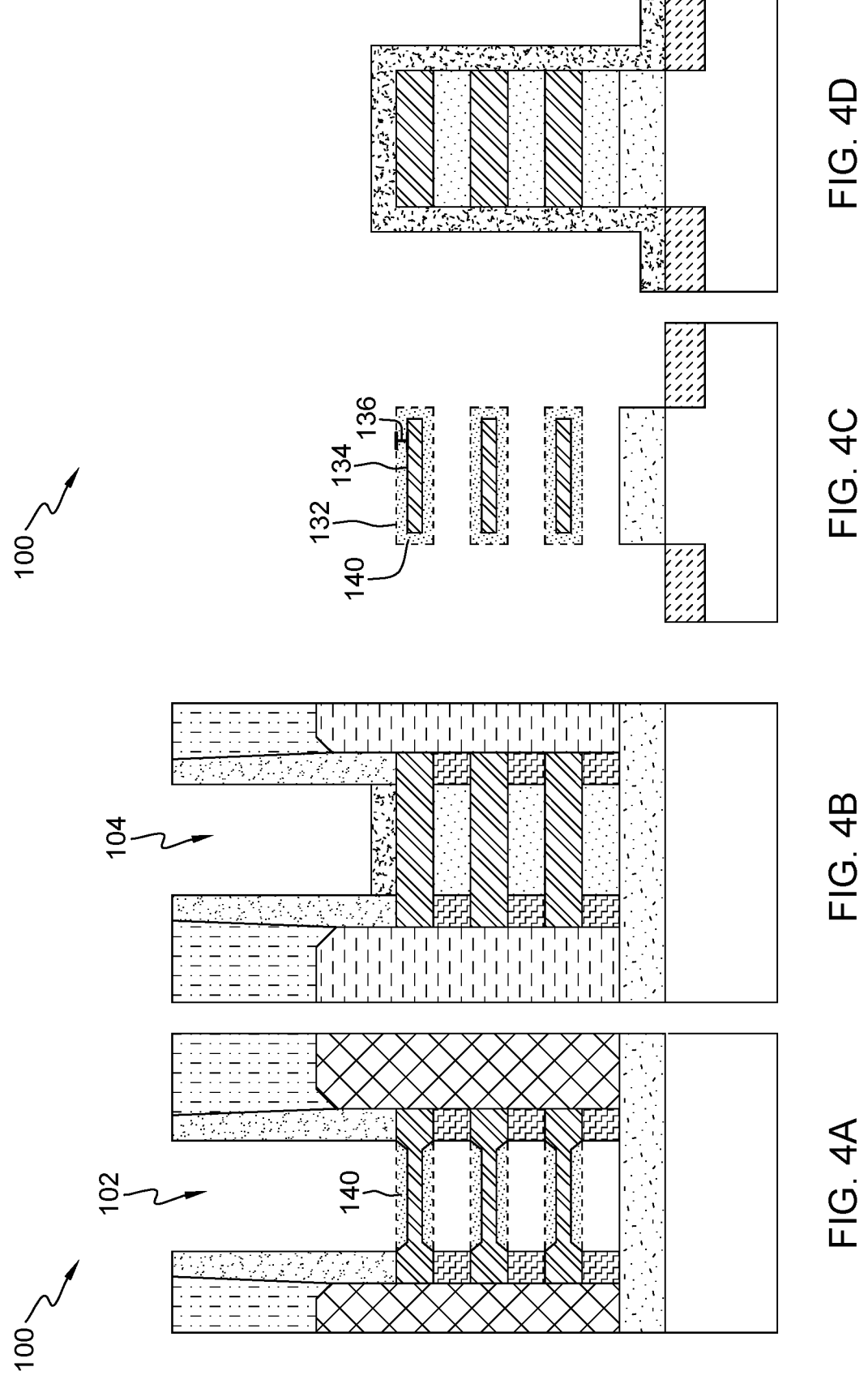
FIGS. 4A-4D depict cross-sectional side views of the semiconductor device of FIGS. 1A-1D at a stage of fabrication, in accordance with one embodiment of the present invention.
Figures 5A, 5B, 5C, 5D:
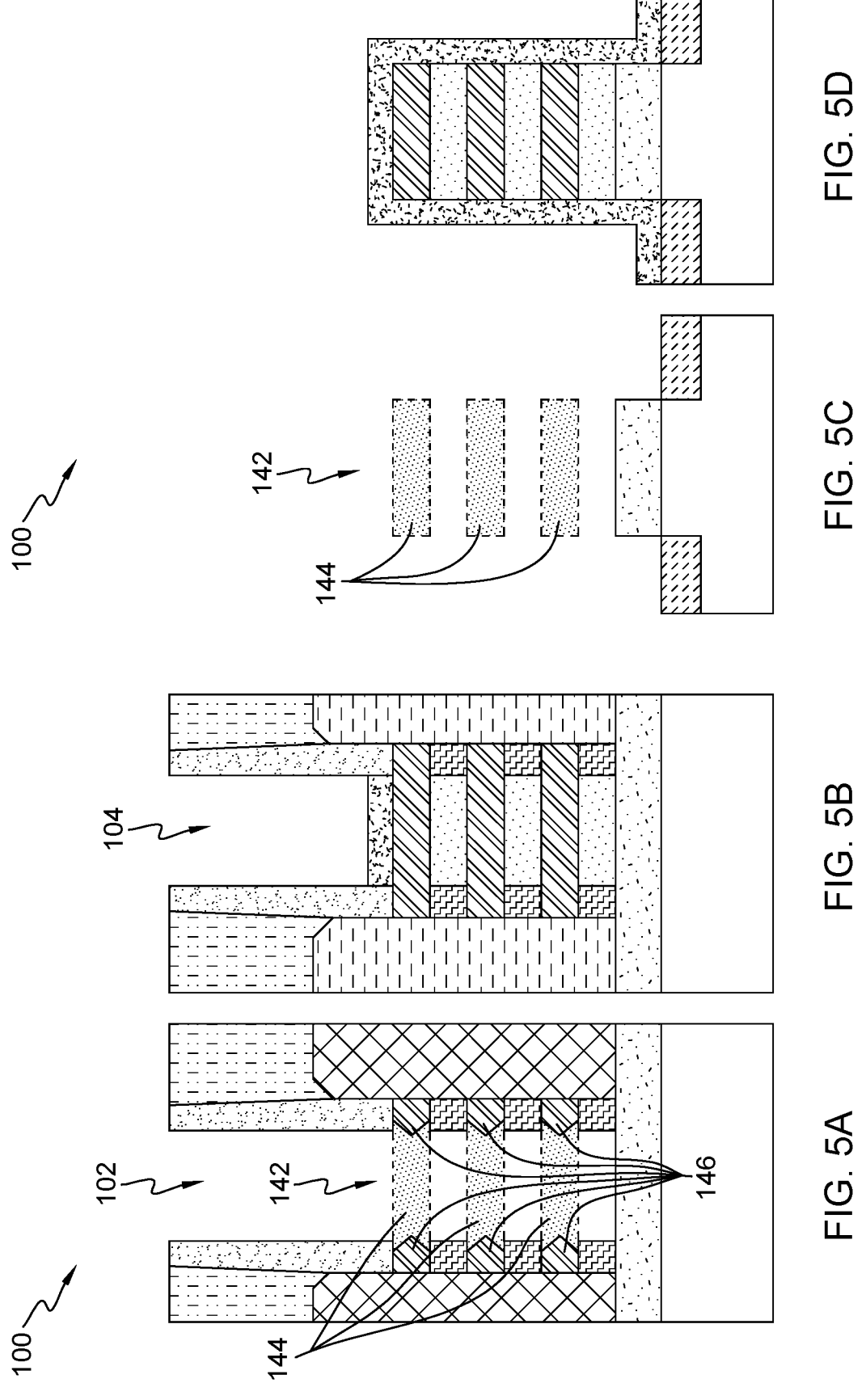
FIGS. 5A-5D depict cross-sectional side views of the semiconductor device of FIGS. 1A-1D at a stage of fabrication, in accordance with one embodiment of the present invention.

FIGS. 2A-2D depict cross-sectional side views of the semiconductor device 100 at a stage of fabrication. As mentioned above, the cross-sectional views are the same as those depicted in FIGS. 1A-1D. That is, FIG. 2A shows the pFET device 102 at the cross-sectional view in the first direction; FIG. 2B shows an nFET device 104 at the cross-sectional view in the first direction; FIG. 2C shows the pFET device 102 at the cross-sectional view in a second direction; and FIG. 2D shows the nFET device 104 at the cross-sectional view in the second direction. Subsequent figures will have the same views in the first direction and the second direction without further distinction. The semiconductor structure 100 at this stage of fabrication includes an organic planarization layer (OPL) 130 that is formed over the nFET 104 while the dummy layers 112 are removed from the pFET 102. The OPL 130 may be formed using known deposition, masking, and etching processes. For example, the OPL 130 may be formed as a blanket layer and then subsequently masked and etched by performing lithography to open the pFET region while not opening the nFET region. After OPL etch, the OPL 130 remains in the nFET gate region but is open on the pFET 102. After removal of the protective layer 122, further etch process may then be used to selectively etch the SiGe dummy layers 112 without etching or otherwise affecting the nanosheet channels 110, the spacers 126, or the isolation layer 108.

FIG. 2C shows that the nanosheet channels 110 are suspended in the gate region 114a, and FIG. 2A shows that the nanosheet channels 110 are supported on each side by the spacers 126 and connected to the S/Ds 116, 118. At this fabrication stage, the nanosheet channels 110 of the pFET 102 and the nanosheet channels 110 of the nFET are materially identical, since the nanosheet channels 110 were formed from the same blanket layer fabrication technique. In certain embodiments, the blanket layers of the nanosheet channels 110 contain only silicon.

FIGS. 3A-3D depict cross-sectional side views of the semiconductor device 100 at a stage of fabrication. As mentioned above, the cross-sectional views are the same as those depicted in FIGS. 1A-1D. The semiconductor structure 100 has had the nanosheet channels 110 of the pFET 102 trimmed while the nanosheet channels 110 of the nFET 104 remain protected by the OPL 130. The nanosheet channels 110 are trimmed from original size 132 to a trimmed size 134 using an isotropic etching process that uniformly reduces the nanosheet channels 110 from all directions. A difference 136 between the original size 132 and the trimmed size 134 may be customized by the selection of etchant material, strength of the etchant material, and time under which the nanosheet channels 110 are submitted to the etchant. Trimmed, as used herein does not include etching the nanosheet channels 110 to the breaking point, but rather means that the cross-sectional area of the nanosheet channels 110 is reduced.

FIGS. 4A-4D depict cross-sectional side views of the semiconductor device 100 at a stage of fabrication. As mentioned above, the cross-sectional views are the same as those depicted in FIGS. 1A-1D. The semiconductor structure 100 includes SiGe cladding 140 that is epitaxially grown onto the trimmed silicon of the nanosheet channels 110. The OPL 130 over the nFET 104 is selectively removed before this stage, but the protective layer 122 remains over the nFET 104 to prevent epitaxial growth during formation of the SiGe cladding 140. The SiGe cladding 140 may fill-in the difference 136 such that the nanosheet channels 110 of the pFET 102 are the same original size 132 as the nanosheet channels 110 before the trimming step described above. In certain embodiments, the cladding may be smaller or larger than the difference 136 such that the nanosheet channel 110 has an overall size that is larger or smaller than the original size 132. A second trimming step may also be included to ensure that the SiGe cladding 140 includes the correct percentage of germanium and the correct size 132 of the nanosheet channel 110. The SiGe cladding 140 may include a higher-percentage germanium material compared to the SiGe of the dummy layers 112.

The SiGe cladding 140 may be applied to the trimmed nanosheet channels 110 after the OPL 130 is removed from the nFET 104. The cladding step may be accomplished using known deposition techniques such as selective deposition, atomic-layer deposition (ALD), chemical vapor deposition (CVD) and physical vapor deposition (PVD). Most often, the SiGe cladding 140 is epitaxially grown.

FIGS. 5A-5D depict cross-sectional side views of the semiconductor device 100 at a stage of fabrication. As mentioned above, the cross-sectional views are the same as those depicted in FIGS. 1A-1D. The semiconductor structure 100 includes diffused (i.e., thermally mixed) nanosheet channels 142 in the pFET 102. The diffused nanosheet channels 142 include a gate section 144 having SiGe, and a junction section 146 having unreacted silicon surrounded by the spacers 126. The diffused nanosheet channel 142 is formed by thermally diffusing the SiGe cladding 140 throughout the silicon of the nanosheet channel 110. That is, the semiconductor structure 100 is heated in such a way that the higher germanium percentage of the SiGe cladding 140 diffuses and spreads through the silicon of the nanosheet channel 110 (i.e., the silicon remaining at the trimmed size 134 of the nanosheet channel 110). The diffused nanosheet channel 142 may have the SiGe diffused in a "uniform" or "graded" manner. Uniform diffusion means that the germanium is completely diffused through the diffused nanosheet channel 142, such that the profile is uniform without variation. Graded diffusion means that the germanium is incompletely diffused through the diffused nanosheet channel 142, such that the profile is graded, with a higher concentration of silicon in the center core of the diffused nanosheet channel 142, and higher concentration of germanium away from the center core of the diffused nanosheet channel 142. The formation of the SiGe cladding 140 and the thermal conditions of the diffusing may be controlled to ensure that the SiGe cladding 140 does not diffuse fully into the junction section 146 of the diffused nanosheet channel 142. The temperature of the semiconductor structure 100 is also controlled during the thermal diffusion process to ensure that the other components do not suffer damage (e.g., through melting or generating defects). For instance, the temperature and duration of the thermal treatment may be selected to ensure that the SiGe of the dummy layers 112 of the nFET 104 do not diffuse into the nanosheet channels 110, and to prevent/minimize dopant diffusion from the S/Ds 116, 118 into the nanosheet channels 110. The dummy layers 112 may also include a SiGe percentage that is low enough that diffusion is unlikely.

FIGS. 6A-6D depict cross-sectional side views of the semiconductor device 100 at a stage of fabrication. As mentioned above, the cross-sectional views are the same as those depicted in FIGS. 1A-1D. The semiconductor structure 100 includes a second OPL 148 covering the pFET 102 while the protective layer 122 and the dummy layers 112 are removed from the nFET 104. The pFET 102 may also include a silicon cap 150 that is epitaxially grown on the diffused nanosheet channel 142 before the second OPL 148 is deposited. The silicon cap 150 protects the SiGe surface and forms a Si layer for lower interface trap state density and improved electrostatics for the transistor.

Figures 6A, 6B, 6C, 6D:
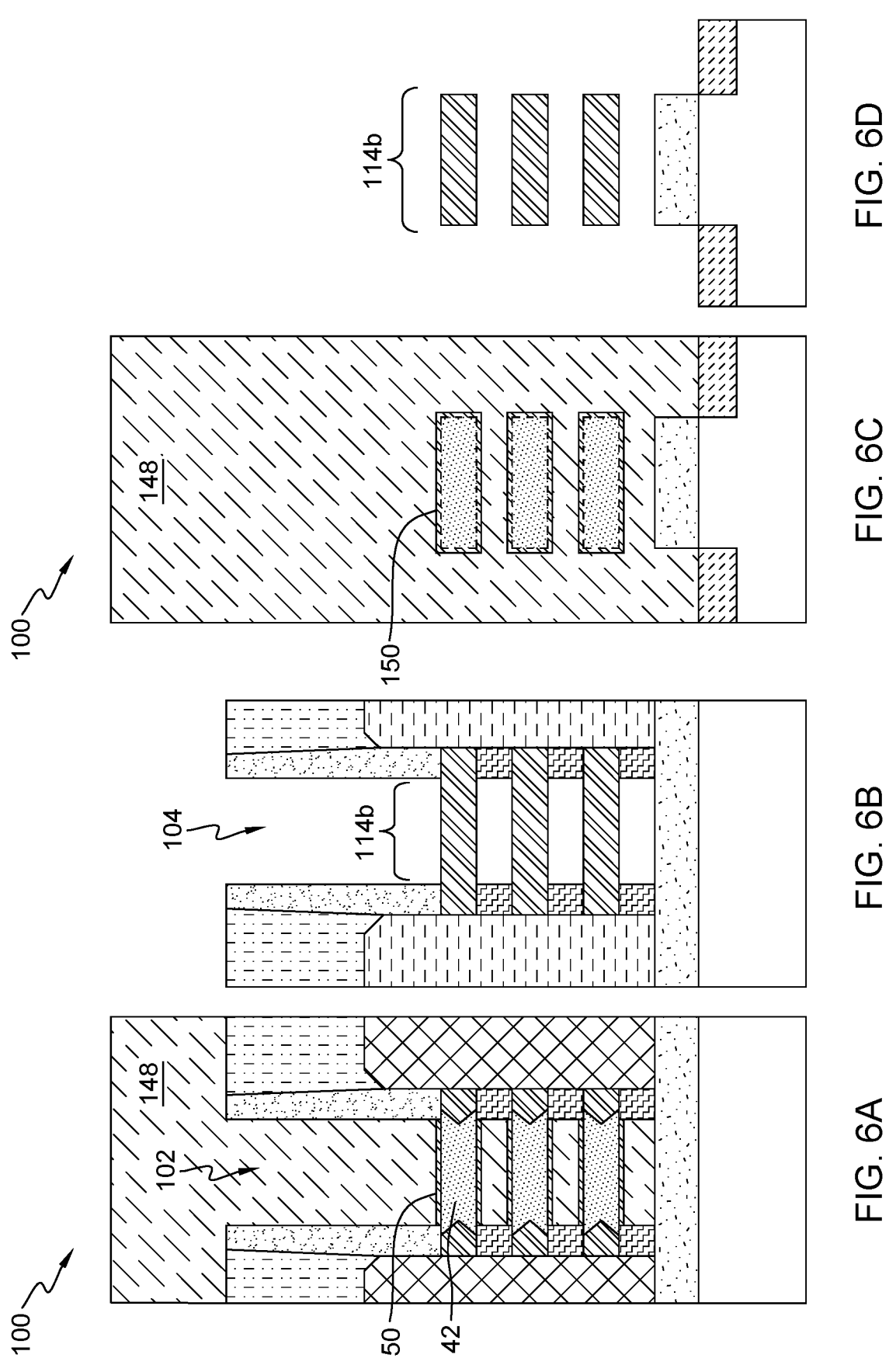
FIGS. 6A-6D depict cross-sectional side views of the semiconductor device of FIGS. 1A-1D at a stage of fabrication, in accordance with one embodiment of the present invention.
Figures 7A, 7B, 7C, 7D:
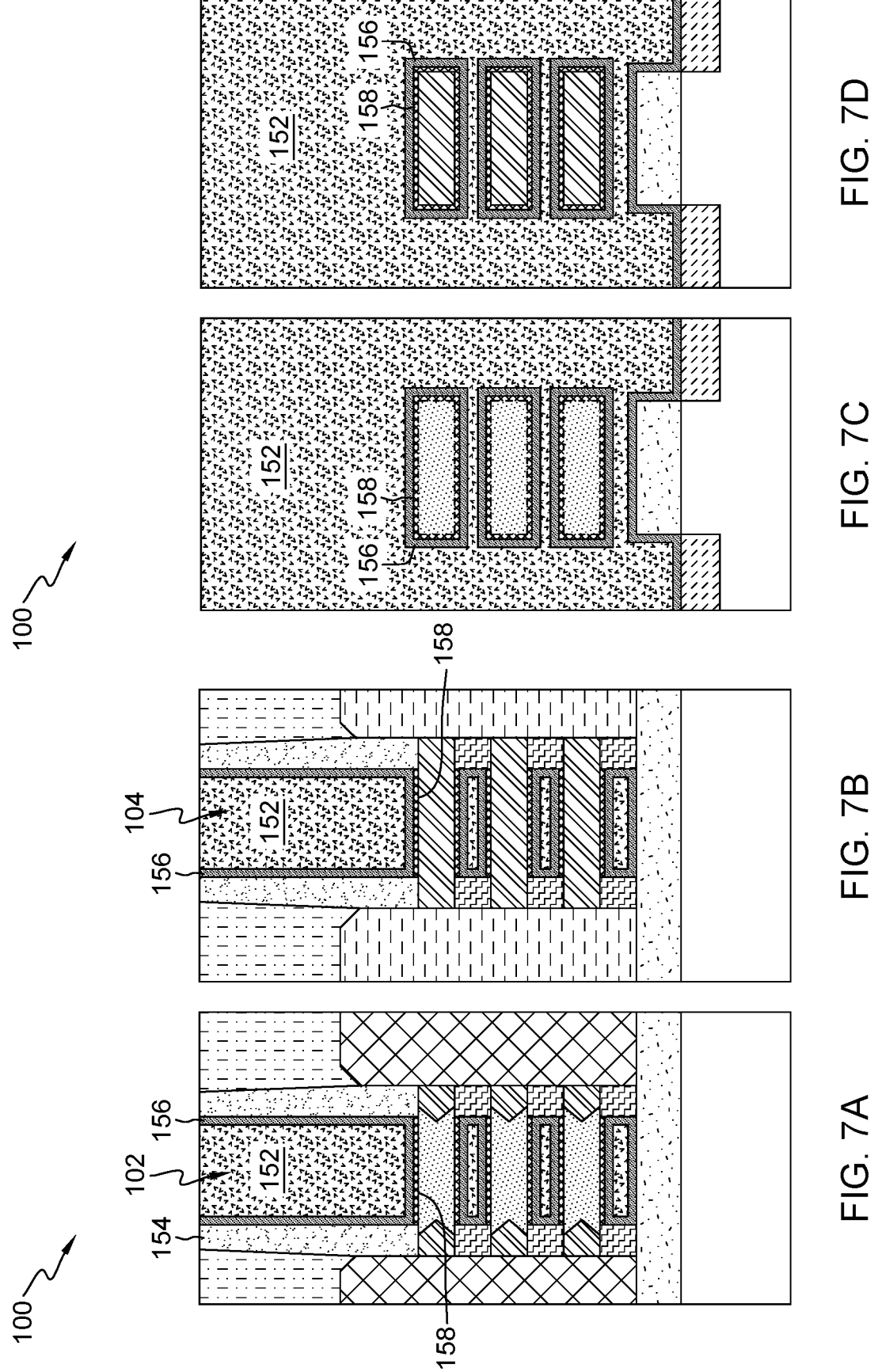
FIGS. 7A-7D depict cross-sectional side views of the semiconductor device of FIGS. 1A-1D at a stage of fabrication, in accordance with one embodiment of the present invention.
Figures 8A, 8B, 8C, 8D:
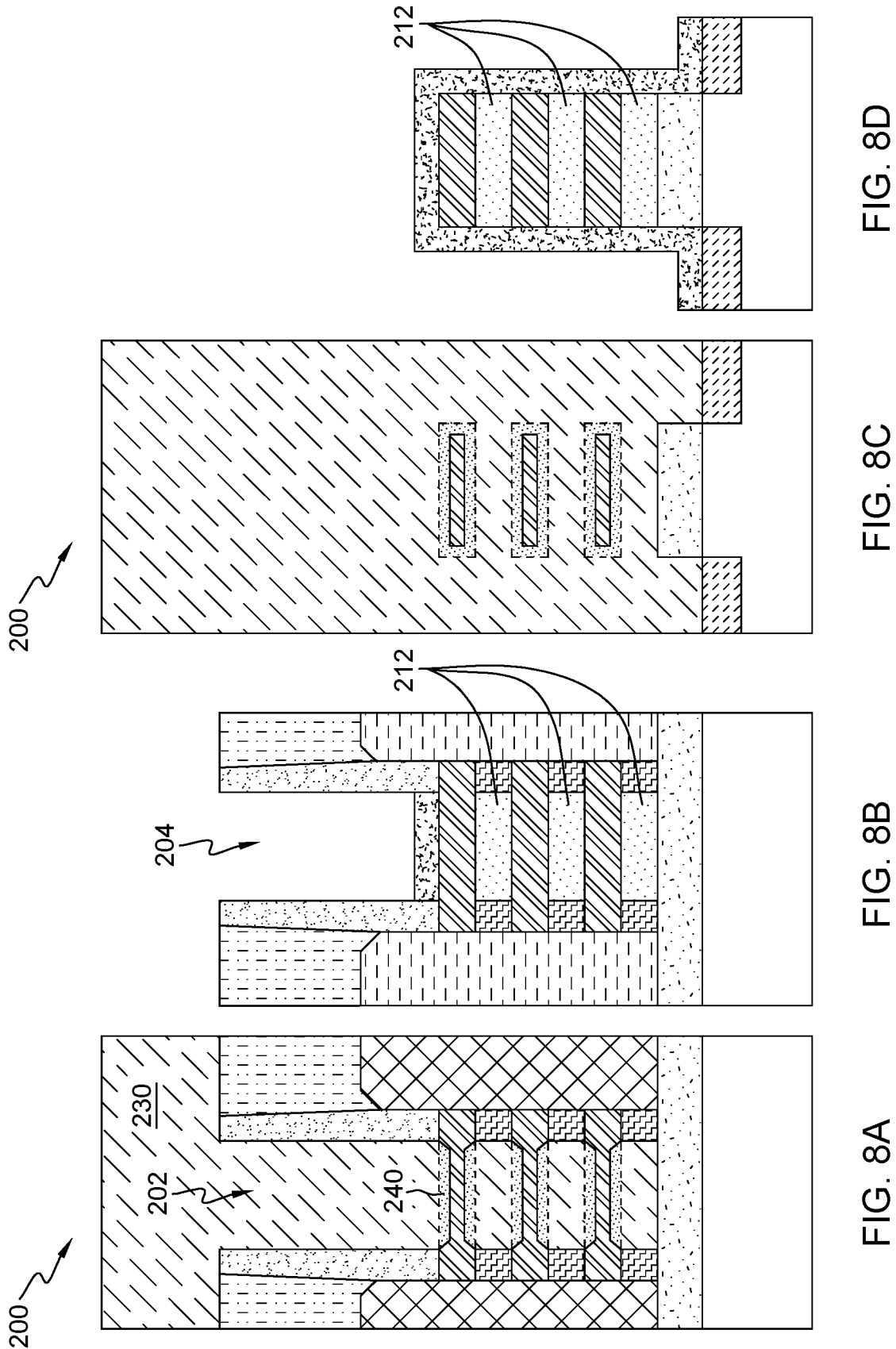
FIGS. 8A-8D depict cross-sectional side views of a semiconductor device of FIGS. 1A-1D at a stage of fabrication, in accordance with one embodiment of the present invention.

Removal of the dummy layers 112 leaves the nanosheet channels 110 of the nFET 104 suspended between the spacers 126. That is, as shown in FIG. 6D, the nanosheet channels 110 are floating in the gate region 114b. Also, FIG. 6B shows that the nanosheet channels 110 are supported on each side by the spacers 126.

FIGS. 7A-7D depict cross-sectional side views of the semiconductor device 100 at a stage of fabrication. As mentioned above, the cross-sectional views are the same as those depicted in FIGS. 1A-1D. The semiconductor structure 100 includes high-K metal gates (HKMG) 152, deposited in the gate regions 114a, b, that are used to control the carrier flow through the pFET 102 and through the nFET 104. The HKMG 152 is insulated from the S/Ds 116, 118 by spacers 154, and may include a high-κ dielectric 156 around a work function metal of the HKMG 152. Additionally, the gate regions 114a, b may include an interfacial layer (IL) 158 that surrounds the nanosheet channels 110, 142 to increase adherence and function of the HKMG 152 with regard to the functioning of the nanosheet channels 110, 142. The IL 158 may consume the silicon cap 150, in certain embodiments.

The HKMGs 152 controls the signal through the pFET 102 and the nFET 104 by controlling a charge near the nanosheet channels 110, 142 so that a signal may pass therethrough. The charge on the HKMG 152 moves electrons in the nanosheet channels 110 of the nFET 104 and moves holes (area in the nanosheet channels 142 without an electron) in the pFET 102. Since the holes move through SiGe faster than moving through silicon, the uniform graded SiGe nanosheet channels 142 of the pFET will function more quickly and more efficiently than pFET devices using silicon nanosheet channels. The formation method described above enables two distinct nanosheet channel compositions, while still using the known alternating nanosheet formation techniques involving the dummy layers 112. Specifically, the thermal diffusion of the SiGe cladding 140 enables the nanosheet channels 110 made out of pure silicon to be converted to SiGe nanosheet channels 142 so that the pFET 102 may function more quickly and efficiently.

FIGS. 8A-8D depict cross-sectional side views of a semiconductor device 200 at a stage of fabrication. The cross-sectional views are the same as those depicted in FIGS. 1A-1D. The semiconductor structure 200 may be formed using the process described above in the description of FIGS. 1A-1D through FIGS. 4A-4D. That is, rather than thermally diffusing a SiGe cladding 240 as shown in FIGS. 5A-5D, a pFET 202 may be masked by OPL 230 so that dummy layers 212 can be removed from an nFET 204. In certain embodiments, a protective insulator layer may be deposited before the OPL and stripped before thermal mix.

Figures 9A, 9B, 9C, 9D:
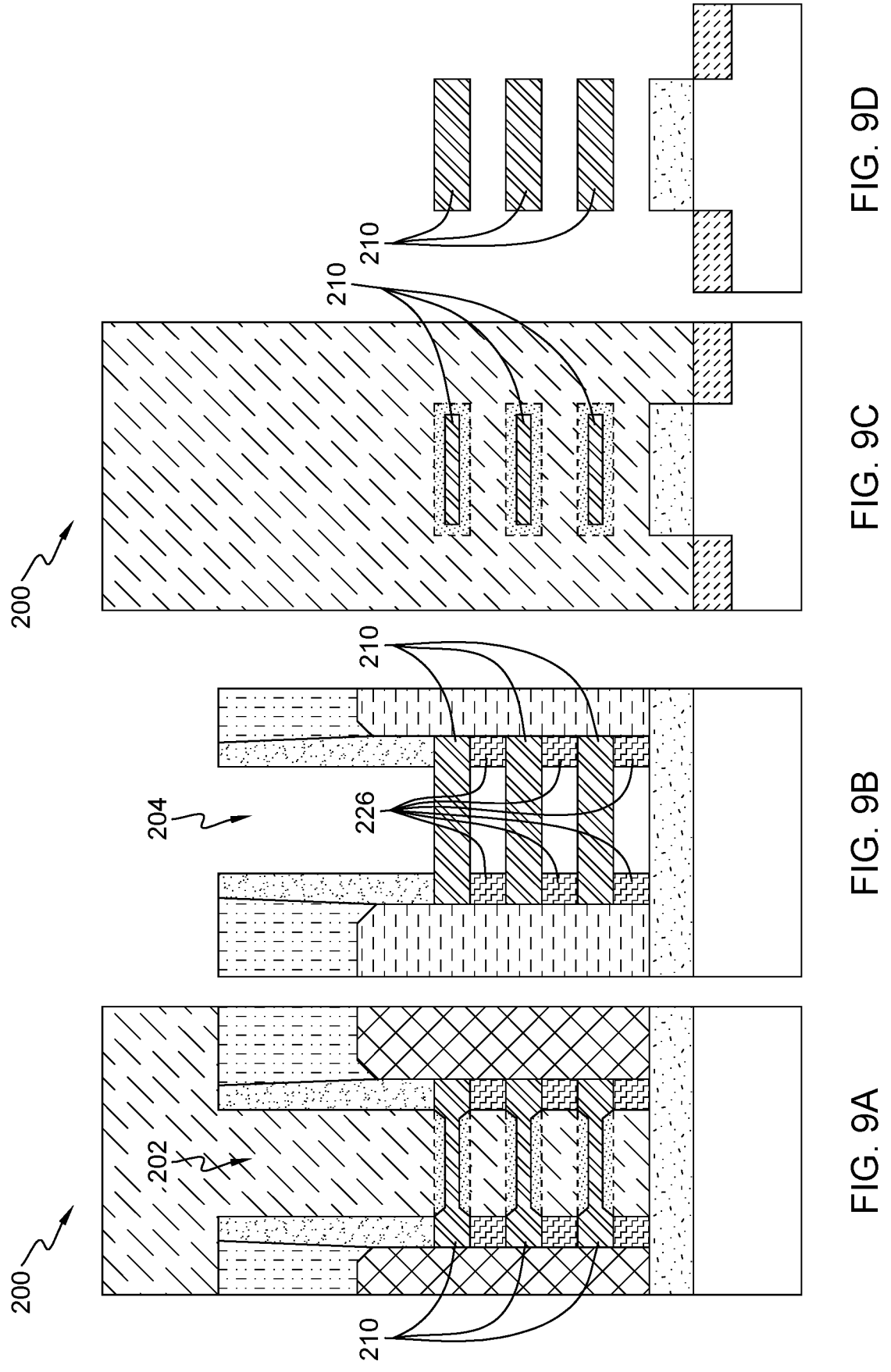
FIGS. 9A-9D depict cross-sectional side views of the semiconductor device of FIGS. 8A-8D at a stage of fabrication, in accordance with one embodiment of the present invention.
Figures 10A, 10B, 10C, 10D:
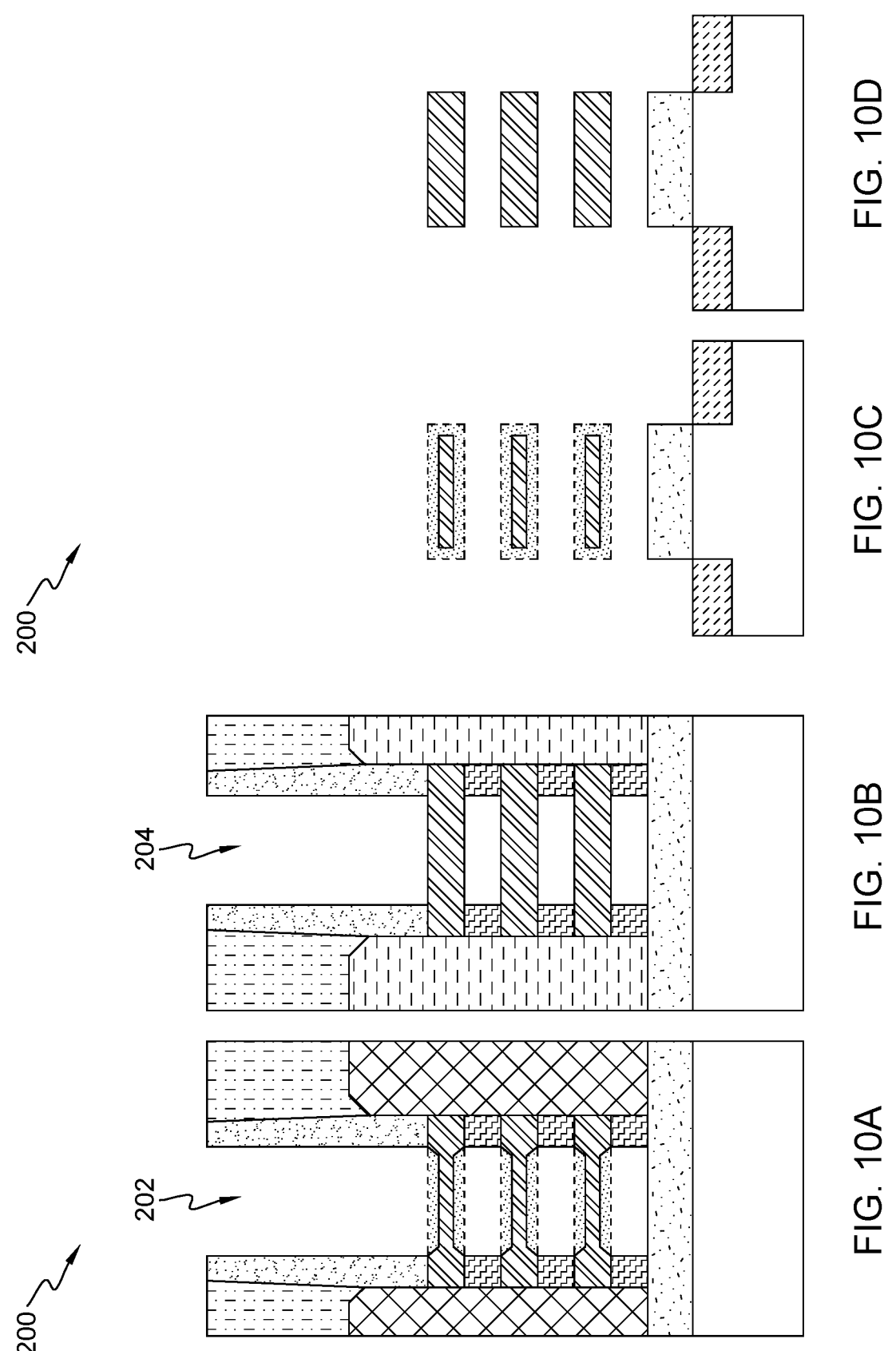
FIGS. 10A-10D depict cross-sectional side views of the semiconductor device of FIGS. 8A-8D at a stage of fabrication, in accordance with one embodiment of the present invention.

FIGS. 9A-9D depict cross-sectional side views of the semiconductor device 200 at a stage of fabrication. As mentioned above, the cross-sectional views are the same as those depicted in FIGS. 1A-1D. The semiconductor structure 200 at this fabrication stage includes the pFET 202 having nanosheet channels 210 with SiGe cladding 240, and the nFET 204 having nanosheet channels 210 with no SiGe cladding 240 and no dummy layers 212. The OPL 230 protects the SiGe cladding 240 from the etch method for removing the dummy layers 212, as the etchant would otherwise remove or damage the SiGe cladding 240. As shown in FIGS. 9B and 9D, the nanosheet channels 210 are floating, and supported only by spacers 226 at each end.

FIGS. 10A-10D depict cross-sectional side views of the semiconductor device 200 at a stage of fabrication. As mentioned above, the cross-sectional views are the same as those depicted in FIGS. 1A-1D. The semiconductor structure 200 at this fabrication stage includes both the nanosheet channels 210 of the nFET 204 and the nanosheet channels 210 of the pFET 202 supported only by the spacers 226 and the S/Ds 116, 118. After OPL removal, the nanosheet channels 210 of the pFET 202 are ready for thermal diffusion, after which the process will continue similarly to the process depicted in FIGS. 6A-6D. The embodiment of the semiconductor device 200 may avoid diffusion of the dummy layers 212 into the nanosheet channels 210. That is, to avoid the diffusion of the SiGe from the dummy layers 212 into the nanosheet channels 210, the semiconductor structure 200 may undergo thermal diffusion after the removal of the dummy layers 212 rather than before the removal of the dummy layer 112 depicted above.

The integrated circuit chips resulting from the processes described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application is not limited to the exact forms and details described and illustrated, but fall within the scope of the appended claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor structure, comprising:
    a first transistor, comprising:
        a first source/drain (S/D);
        a metal gate;
        a spacer between the first S/D and the metal gate;

a first nanosheet channel, comprising:

a gate section comprising silicon-germanium (SiGe) surrounded by the metal gate, wherein the gate section of the first nanosheet channel of the first transistor is trimmed, and wherein the first nanosheet channel is supported by spacers at a junction section, and wherein the gate section is clad with silicon- germanium (SiGe), and wherein the germanium of the SiGe within the gate section is diffused; and a junction section comprising silicon surrounded by the spacer.

2. The semiconductor structure of claim 1, further comprising an isolation layer formed between the first transistor and a substrate.

3. The semiconductor structure of claim 1, wherein the first S/D comprises a p+ material.

4. The semiconductor structure of claim 3, further comprising a second transistor comprising an n+ S/D.

5. The semiconductor structure of claim 4, wherein the second transistor comprises a second nanosheet channel comprising silicon within a gate section and a junction section.

6. The semiconductor structure of claim 1, wherein the SiGe comprises a selection from the group consisting of:

a uniform diffusion of germanium through the first nanosheet channel; and a graded diffusion of germanium through the first nanosheet channel.

7. The semiconductor structure of claim 1, wherein the SiGe is at least partially between the metal gate and the junction section.

8. The semiconductor structure of claim 1, wherein the spacer and the first nanosheet channel are flush with each other.

9. The semiconductor structure of claim 1, wherein at least the first nanosheet is suspended between two or more spacers.

10. A semiconductor structure, comprising:

a first nanosheet channel between a first source/drain (S/D) and a second S/D, comprising:

a first junction section comprising silicon and a first percentage of germanium; and a gate section comprising silicon-germanium (SiGe) at a second percentage of germanium, wherein the gate section of the first nanosheet channel is trimmed, and wherein the first nanosheet channel is supported by spacers at a junction section, and wherein the gate section is clad with silicon-germanium (SiGe), and wherein the germanium of the SiGe within the gate section is diffused.

11. The semiconductor structure of claim 10, wherein the first percentage of germanium is zero.

12. The semiconductor structure of claim 10, wherein the first S/D and the second S/D are p+ regions.

13. The semiconductor structure of claim 10, further comprising a second junction section comprising the first percentage of germanium, wherein the first junction contacts the first S/D and the second junction contacts the second S/D.

14. The semiconductor structure of claim 10, wherein the SiGe comprises a selection from the group consisting of:

a uniform diffusion of germanium through the first nanosheet channel; and a graded diffusion of germanium through the first nanosheet channel.

15. The semiconductor structure of claim 14, wherein the SiGe is at least partially between the metal gate and the junction section.

\* \* \* \* \*